United States Patent
Pupalaikis

(10) Patent No.: US 7,711,510 B2
(45) Date of Patent: May 4, 2010

(54) METHOD OF CROSSOVER REGION PHASE CORRECTION WHEN SUMMING SIGNALS IN MULTIPLE FREQUENCY BANDS

(75) Inventor: Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 99 days.

(21) Appl. No.: 11/960,137

(22) Filed: Dec. 19, 2007

(65) Prior Publication Data

US 2008/0120053 A1     May 22, 2008

Related U.S. Application Data

(63) Continuation-in-part of application No. 11/280,671, filed on Nov. 16, 2005, now abandoned, and a continuation-in-part of application No. 11/729,606, filed on Mar. 29, 2007, now Pat. No. 7,373,281, which is a continuation of application No. 11/281,075, filed on Nov. 17, 2005, now Pat. No. 7,219,037, and a continuation-in-part of application No. 10/693,188, filed on Oct. 24, 2003, now Pat. No. 7,058,548.

(60) Provisional application No. 60/629,050, filed on Nov. 18, 2004, provisional application No. 60/656,865, filed on Feb. 25, 2005, provisional application No. 60/656,616, filed on Feb. 25, 2005, provisional application No. 60/420,937, filed on Oct. 24, 2002.

(51) Int. Cl.
*G01R 23/00* (2006.01)
*G06F 17/00* (2006.01)

(52) U.S. Cl. .......................... 702/106; 702/76; 702/72; 702/75; 702/190; 375/226; 375/227

(58) Field of Classification Search ................... 702/79, 702/72, 75, 76, 106, 190
See application file for complete search history.

(56) References Cited

U.S. PATENT DOCUMENTS 3,783,413 A     1/1974   Froment et al.

(Continued)

FOREIGN PATENT DOCUMENTS

EP    0275136    7/1988
EP    0589594    3/1994

OTHER PUBLICATIONS

USPTO Office Action dated Apr. 24, 2009 which issued in U.S. Appl. No. 12/102,946, entitled: High Bandwidth Oscilloscope which was filed on Apr. 15, 2008., 1-12.

(Continued)

*Primary Examiner*—Hal D Wachsman
(74) *Attorney, Agent, or Firm*—Gordon Kessler

(57) ABSTRACT

A signal processing system compensates for the relative phase difference between multiple frequency bands so that the combination of the bands is constructive throughout a substantial portion of the band overlap or crossover region. In one embodiment, a signal combining system may include a comparator for determining a relative phase difference between the two signals within a predefined crossover region, a phase adjusting element for adjusting a phase of one of the two signals; and a combiner for combining the phase-adjusted signal and the other of the two signals.

17 Claims, 11 Drawing Sheets

U.S. PATENT DOCUMENTS

| | | | |
|---|---|---|---|
| 3,891,803 A | 6/1975 | Daquet et al. | |
| 3,903,484 A | 9/1975 | Testani | |
| 4,316,282 A | 2/1982 | Macina | |
| 4,354,277 A | 10/1982 | Crackel et al. | |
| 4,570,153 A | 2/1986 | Kobayashi et al. | |
| 5,185,801 A * | 2/1993 | Meyer et al. | 381/59 |
| 5,187,803 A | 2/1993 | Sohner et al. | |
| 5,323,391 A | 6/1994 | Harrison | |
| 5,412,690 A | 5/1995 | Kotzin et al. | |
| 5,469,219 A | 11/1995 | Mortensen | |
| 5,602,847 A | 2/1997 | Pagano et al. | |
| 5,659,546 A | 8/1997 | Elder | |
| 5,668,836 A | 9/1997 | Smith et al. | |
| 5,937,341 A | 8/1999 | Suominen | |
| 5,950,119 A | 9/1999 | McGeehan et al. | |
| 5,978,742 A | 11/1999 | Pickerd | |
| 6,009,130 A | 12/1999 | Lurey et al. | |
| 6,240,150 B1 | 5/2001 | Darveau et al. | |
| 6,242,899 B1 | 6/2001 | Miller | |
| 6,271,773 B1 | 8/2001 | Kobayashi | |
| 6,340,883 B1 | 1/2002 | Nara et al. | |
| 6,380,879 B2 | 4/2002 | Kober et al. | |
| 6,542,914 B1 | 4/2003 | Pupalaikis | |
| 6,567,030 B1 | 5/2003 | Pupalaikis | |
| 6,701,335 B2 | 3/2004 | Pupalaikis | |
| 6,819,279 B2 | 11/2004 | Pupalaikis | |
| 6,888,888 B1 | 5/2005 | Tu et al. | |
| 6,975,685 B1 | 12/2005 | Merriam, Jr. | |
| 7,050,918 B2 | 5/2006 | Pupalaikis et al. | |
| 7,092,475 B1 * | 8/2006 | Huard | 375/375 |
| 7,152,008 B2 * | 12/2006 | Zumkehr et al. | 702/106 |
| 7,219,037 B2 | 5/2007 | Pupalaikis et al. | |
| 7,333,582 B2 * | 2/2008 | Yoshikawa et al. | 375/376 |
| 7,373,281 B2 | 5/2008 | Pupalaikis et al. | |
| 2002/0150173 A1 | 10/2002 | Buda | |
| 2002/0181614 A1 | 12/2002 | Mostafa et al. | |
| 2003/0112825 A1 * | 6/2003 | Wang et al. | 370/491 |
| 2004/0041599 A1 | 3/2004 | Murphy | |
| 2004/0128076 A1 | 7/2004 | Pupalaikis et al. | |
| 2004/0162691 A1 * | 8/2004 | Pupalaikis et al. | 702/106 |
| 2004/0246047 A1 | 12/2004 | Manku et al. | |
| 2004/0252044 A1 | 12/2004 | Mathis et al. | |
| 2005/0089086 A1 * | 4/2005 | Hwang et al. | 375/148 |
| 2005/0122885 A1 * | 6/2005 | Kanaoka | 369/124.05 |
| 2005/0273482 A1 | 12/2005 | Moore | |
| 2006/0080065 A1 | 4/2006 | Pupalaikis et al. | |
| 2006/0247870 A1 | 11/2006 | Pickerd | |
| 2006/0267811 A1 | 11/2006 | Tan | |

OTHER PUBLICATIONS

"Real-time spectrum analysis tools aid transition to third-generation wireless technology", *Tektronix, Inc*, (1999),1-6.

"A matter of time: Today's RF signals call for a different kind of spectrum analysis", *Tektronix, Inc*, (2000),1-8.

"Putting undersamplinq to work", *Pentek, Inc*, 1-2.

"Sampling and reconstruction of periodic signals", *DSP-FPGA. COM*, 1-15, Oct. 15, 2004.

"Electronics engineers' handbook", (1975), 8 pages.

Jong, M T., "Methods of discrete signal and system analysis", McGraw-hill Book company,(1982),369-374.

"Signature—high performance signal analyzer 100Hz to 8GHz", *Anritsu*, (2000), 1-2.

"Agilent E5052A signal source analyzer 10MHz to 7GHz", *Agilent Technologies*, (Jun. 9, 2004), 1, 6, 7.

"R3681 Signal analyzer", *Advantest*, (2004),1-2.

Paquelet, Stephanie et al., "RF front-end considerations for SDR Ultra-wideband communications systems", *RF Design*, (Jul. 2004),44-51.

Apolinario, Jr, J.A. et al., "On perfect reconstruction in critically sampled frequency-domain scrambler", 1-4.

Johannson, Hakan et al., "Reconstruction of Nonuniformly sampled bandlimited signals by means of digital fractional delay filters", IEEE Transactions on signal processing vol. 50 No. 11,(Nov. 2002),2757-2767.

Velazquez, Scott R., "High-performance advanced filter bank analog-to-digital converter for universal RF receivers", *V Company. IEEE.* (1998),229-232.

Lee, Hyung-Jin et al., "Frequency domain approach for CMOS ultra-wideband radios", *Proceedings for the IEEE computer society annual symposium on VLSI*, (2003),1-2.

Ding, G et al., "Frequency-interleaving technique for high-speed A/D conversion", *IEEE*, (2003),1857-1860.

Velazquez, Scott R., et al., "Design of hybrid filter banks for analog/digital conversion", *IEEE transactions on signal processing vol. 46*, No. 4, (Apr. 4, 1998),956-967.

Hoyos, Sebastian et al., "Analog to digital conversion of ultra-wideband signals in orthogonal spaces", *IEEE*, (2003),47-51.

Lyons, Richard G., "Understanding digital signal processing", *Prentice Hall professional technical reference*, second edition, (2004),30-39, 346-360, 471-479, 571-572.

Luo, Xiliang et al., "Real-time speech frequency scrambling and descrambling", 1-17.

"Advanced transmission library: Optional block function library for hypersignal block diagram/ride", *Hyperception, Inc*, (1997),1-2.

"Japanese abstract of JP 06 197019", *Hitachi Denshi., LTd*, (Jul. 15, 1994).

Adam, Stephen F., "Microwave Theory and Applications", *Prentice Hall*, (1969),490-500.

"Genesys, 2004 RF Microwave Design Software—Simulation", *Eagleware Corporation*, (2004),108-110.

Smith, Julius O., "MUS420/EE367A Lecture 4A, Interpolated Delay Lines, Ideal Bandlimited Interpolation, and Fractional Delay Filter Design", *Stanford University*, 1-50, Dec. 28, 2005.

Mueller, James J., et al., "Method and Apparatus for Artifact Signal Reduction in Systems of Mismatched Interleaved Digitizers", U.S. Appl. No. 11/280,493, filed Nov. 16, 2005.

Pupalaikis, Peter J., et al., "Method of Crossover Region Phase Correction when Summing Multiple Frequency Bands", U.S. Appl. No. 11/280,671, filed Nov. 16, 2005.

Pupalaikis, Peter J., "Bilinear Transformation Made Easy", *ICSPAT 2000 Proceedings, CMP Publications*, (2000),1-5.

"Digital Signal Processing Applications Using the ADSP-2100 Family", *Prentice Hall*, (1990),458-461.

Mueller, James et al., "Method and apparatus for spurious tone reduction in systems of mismatched interleaved digitizers", U.S. Appl. No. 60/656,616, filed Feb. 25, 2005.

Nealen, Andrew "An As-Short-As-Possible Introduction to the Least Squares, Weighted Least Squares and Moving Least Squares Methods for Scattered Data Approximation and Interpolation", *Discrete Geometric Modeling Group TU Darmstadt*, 1-3.

"Weighted Least Squares", *Engineering Statistics Handbook Section 4.1.4.3*, 1-2, Dec. 11, 2007.

* cited by examiner

| # | | Description |
|---|---|---|
| 1 | $\Phi rel$ — N point vector of relative phase (HF-LF) in degrees<br>$f$ — N point vector of frequency<br>$M, \theta, D$ — estimations of variables to determine from last iteration (initial guess on first iteration)<br>$\lambda$ — gradient (large number) vs. Newton-Gauss (small number) convergenc steering parameter<br>$mse$ — mean-squared error from last iteration (initial mean-squared error on first iteration) | Initial Conditions |
| 2 | for n=0 ... N-1 | for each response point |
| 3 | $R_n = \Phi(x, M, \theta, D) - \Phi rel_n$ | calculate a residual |
| 4 | $J_{n,0} = \dfrac{\partial \Phi}{\partial M}\left(x = 2 \cdot \pi \cdot \dfrac{f_n}{Fs}, M, \theta, D\right)$<br>$J_{n,1} = \dfrac{\partial \Phi}{\partial \theta}\left(x = 2 \cdot \pi \cdot \dfrac{f_n}{Fs}, M, \theta, D\right)$<br>$J_{n,2} = \dfrac{\partial \Phi}{\partial D}\left(x = 2 \cdot \pi \cdot \dfrac{f_n}{Fs}, M, \theta, D\right)$ | calculate a row of the Jacobian matrix |
| 5 | $H = J^T \cdot W \cdot J$ | calculate the approximate Hessian matrix |
| 6 | for j=0 ... 2 | generate a matrix whose diagonal is identical to the Hessian matrix and is zero elsewhere |
| 7 | $D_{j,j} = H_{j,j}$ | |
| 8 | $\Delta P = (H + \lambda \cdot D)^{-1} \cdot J^T \cdot W \cdot R$ | calculate the change in coefficient values |
| 9 | $M = M - \Delta P_0$<br>$\theta = \theta - \Delta P_1$<br>$D = D - \Delta P_2$ | apply the change to the coefficients |
| 10 | $mse_{new} = \dfrac{1}{N} \cdot \sum_n w_n \cdot \left(\Phi(x = 2 \cdot \pi \cdot \dfrac{f_n}{Fs}, M, \theta, D) - \Phi rel_n\right)^2$ | calculate the new mean-squared error |
| 11 | true ← $mse_{new} \geq mse$ → false | did the mean squared error increase? |
| 12 | $\lambda = \lambda \cdot 10$ — favor steepest decent $\quad$ $\lambda = \dfrac{\lambda}{10}$ — favor Newton-Gauss convergence | |

FIG. 14

METHOD OF CROSSOVER REGION PHASE CORRECTION WHEN SUMMING SIGNALS IN MULTIPLE FREQUENCY BANDS

CROSS REFERENCE TO RELATED APPLICATIONS

This application is a continuation-in-part application of U.S. patent application Ser. No. 11/280,671, filed Nov. 16, 2005 by Peter Pupalaikis, entitled "Method of Crossover Region Phase Correction When Summing Signals in Multiple Frequency Bands, currently abandoned. This application is also a continuation-in-part application of U.S. patent application Ser. No. 11/729,606, filed Mar. 29, 2007, entitled "High Bandwidth Oscilloscope, now U.S. Pat. No. 7,373, 281, which is in turn a continuation application of U.S. patent application Ser. No. 11/281,075, filed Nov. 17, 2005 by Peter Pupalaikis et al., entitled "High Bandwidth Oscilloscope", now U.S. Pat. No. 7,219,037. The '075 application in turn claims the benefit of i) U.S. Provisional Patent Application 60/629,050, filed Nov. 18, 2004 by Pupalaikis and entitled "High Bandwidth Oscilloscope," ii) U.S. Provisional Patent Application 60/656,865, filed Feb. 25, 2005 by Pupalaikis et al. and entitled "The Digital Heterodyning Oscilloscope," and iii) U.S. Provisional Patent Application 60/656,616, filed Feb. 25, 2005 by Mueller et al. and entitled "Method and Apparatus for Spurious Tone Reduction in Systems of Mismatched Interleaved Digitizers." The '075 application is also a continuation-in-part of U.S. patent application Ser. No. 10/693, 188, filed Oct. 24, 2003 by Pupalaikis et al. and entitled "High Bandwidth Real Time Oscilloscope," now U.S. Pat. No. 7,058,548, which claims the benefit of U.S. Provisional Patent Application 60/420,937, filed Oct. 24, 2002 by Pupalaikis et al. and entitled "High Bandwidth Real Time Oscilloscope."

BACKGROUND

A digital oscilloscope is a tool utilized by engineers to view signals in electronic circuitry. As circuits and signals get ever faster, it is beneficial to have digital oscilloscopes capable of digitizing, displaying and analyzing these faster signals. The capability of a digital oscilloscopes to digitize fast signals may be measured by its bandwidth and sample rate. The sample rate is the number of samples points taken of a waveform in a given amount of time and is inversely proportional to the sample period—the time between samples. If a sinusoidal frequency sweep is performed from DC up to higher frequencies, the bandwidth is the frequency at which the signal displayed on the digital oscilloscope screen is approximately 30% smaller than the input sine wave.

Since one of the uses of the digital oscilloscope is to design and analyze new electronic devices, high end digital oscilloscopes generally operate at speeds much higher than the present state of the art in electronics. These speeds may be achieved through the use of ever-faster sampling chips or the use of alternate methodologies to provide the desired bandwidth.

One such method involves triggering repeatedly on a periodic event. If an event is frequently, periodically repeating, the waveform at the time of the event can be repeatedly displayed on the screen. Data from multiple trigger events average together to provide a good view of the waveform. More particularly, the scope may repeatedly trigger on an event and acquire only a few points of the waveform (sometimes only one point of the waveform) on each trigger event. Scopes having this functionality are sometimes called "sampling scopes." After repeated triggers, the points are reassembled according to the sampling algorithm to create a higher "effective" sample rate version of the waveform. Furthermore, the repeated trigger events permit averaging, which can be utilized to increase the signal-to-noise ratio (SNR) and therefore enable further bandwidth increases. However, such a sampling scope presupposes a repetitive input signal so that the representation of the waveform can be generated over many triggers.

This technique may be unsuitable where the signal that is to be analyzed is not repetitive. For instance, a non-repetitive event such as the cause of some failure in an electronic system. The trigger event may happen repeatedly but the signal around the trigger event may be different. Therefore, it is desirable to achieve a high bandwidth and sample rate with only a single trigger event. Such digital oscilloscopes are sometimes called real-time scopes, and acquisitions taken utilizing only a single trigger event are called single-shot acquisitions.

In real-time digital oscilloscope design, one method for improving sample rate is interleaving. This method utilizes multiple digitizing elements that sample the same waveform at different points in time such that the waveform resulting from combining the waveforms acquired on these multiple digitizers forms a high sample rate acquisition. Most high-end real-time digital oscilloscopes have very high sample rates achieved through the use of interleaving and most are capable of "oversampling" an input waveform.

Another technique is described in U.S. patent application Ser. No. 10/693,188, entitled "High Bandwidth Real-Time Oscilloscope," filed Oct. 24, 2003 by Pupalaikis et al. and assigned to LeCroy Corporation (which is also the assignee of the instant application), now U.S. Pat. No. 7,058,548. Pupalaikis et al. describes a heterodyning technique wherein a low frequency channel acquires the low frequency content of the input signal and a high frequency channel acquires the frequency content of the input signal. This high frequency signal is mixed down from frequency band F→2*F to the range of 0→F so it "fits" into the bandwidth of the front end. It can be seen that twice the frequency content of the signal has been made to "fit" into the bandwidth of the scope. After processing, the high frequency content is mixed upward to its original frequency range and then combined with the low frequency content to generate an output waveform having approximately twice the bandwidth of that the scope would have been able to process otherwise.

In implementing this technique, the input signal may be filtered to separate the high frequency content from the low frequency content. Depending on the technique used to filter the input signal and the sharpness of the associated roll-off, the filter may affect the phase of the input signal non-uniformly. In particular, phase distortion may occur at the filter band edges.

Phase misalignment between overlapping portions of the low frequency content and the high frequency content, which is sometimes referred to as the crossover region, may cause those signals to cancel or partially cancel each other when combined, sometimes called destructive combination. The resulting aggregate response may accordingly have an undesirably attenuated magnitude response or a shifted phase response relative to the input waveform in one or more regions of interest.

SUMMARY

A signal processing system compensates for the relative phase difference between multiple frequency bands so that the combination of the bands is constructive throughout a substantial portion of the band overlap or crossover region. In one embodiment, a signal combining system may include a comparator for determining a relative phase difference between the two signals within a predefined crossover region, a phase adjusting element for adjusting a phase of one of the two signals, and a combiner for combining the phase-adjusted signal with the other of the two signals. In another aspect, a method for adjusting a phase relationship between signals from multiple frequency bands that are being summed may include filtering a first of the signals by applying an integer samples delay, a fractional sample delay filter, and an allpass filter bank; and summing the filtered first signal with a second signal.

Particular embodiments can be implemented to realize one or more of the following advantages. First, nonlinear phase characteristics that may accompany fast roll-off rates at band edges may be substantially reduced or eliminated. Second, destructive signal combination, which may manifest itself in holes or undesirable attenuation in the aggregate frequency response, may be substantially reduced or eliminated.

Still other objects and advantages of the invention will be apparent from the specification and the drawings.

BRIEF DESCRIPTION OF DRAWINGS

For a more complete understanding of the invention, reference is made to the following description and accompanying drawings, in which:

FIG. 14 is a process flow diagram illustrating an iteration of the Levenberg-Marquardt algorithm used to optimize the relative phase characteristic;

Like reference numbers and designations in the various figures indicate like elements.

DETAILED DESCRIPTION OF THE PREFERRED EMBODIMENTS

A detailed description of illustrative embodiments will now be provided, making reference to the figures and providing details of the calculations.

Figure 1:
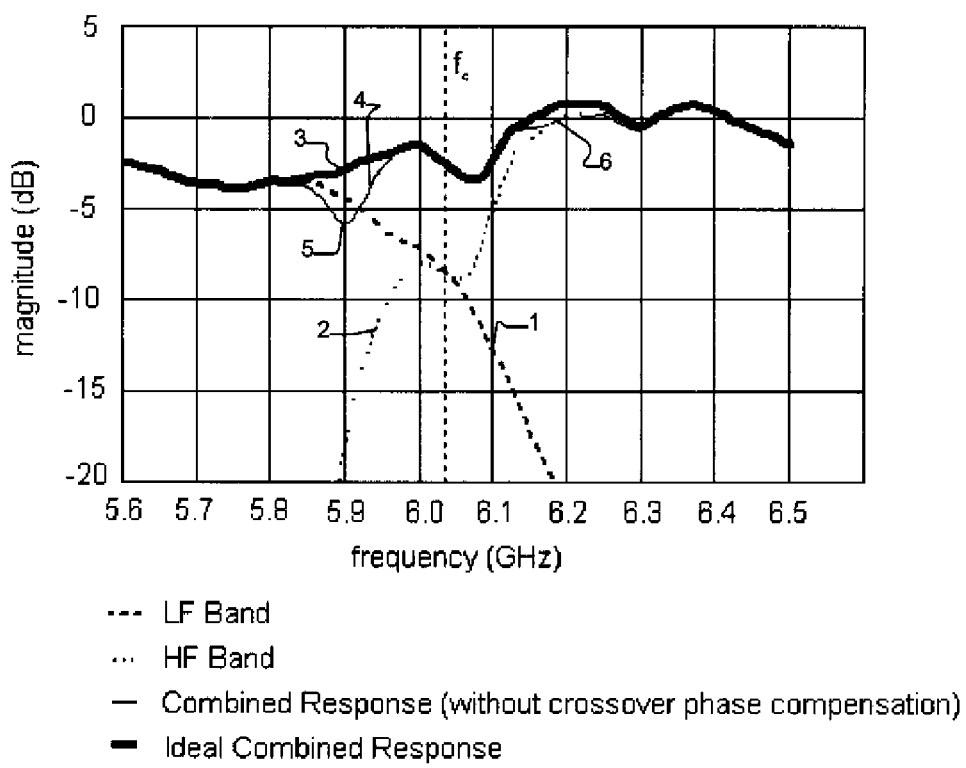
FIG. 1 is a magnitude response graph showing signals from two frequency bands and a composite signal which is the combination of both bands.

FIG. 1 shows the magnitude response of two frequency bands. In FIG. 1a first magnitude response [1] in a first frequency band designated as a low frequency band response, and a second magnitude response [2] in a second frequency band designated as a high frequency band response, are summed together. An ideal resultant combination of these responses is shown and is designated as an ideal combination [3]. Only the magnitudes of the responses are shown in FIG. 1. For the ideal combination [3] to occur, the relative phase between the low frequency and high frequency band responses should be zero. In practice, the band limits are typically the result of filters that have very sharp cutoffs. Such filters with sharp cutoffs often produce group delay variation or phase nonlinearity in a filtered response in the region of the cutoff. Those skilled in the art will understand that it is possible to process the final result of a combination of signals to generate an overall flat response, or a response conforming to some ideal. Such processing, including filtering and compensation, is designed to cause the final response to conform to some ideal other than the summation of the magnitude responses of the individual bands.

FIG. 1 shows the actual summation of the low frequency and high frequency band responses in a particular case and is designated as a combined response without any phase compensation [4]. This combined response is not the same as the ideal response [3]. Specifically, there are two dips in the combined response [4], one at about 5.9 GHz [5] and another at about 6.2 GHz [6]. These dips are due to the fact that the relative phase between the individual responses in the two frequency bands is not zero throughout the crossover region.

Figure 2:
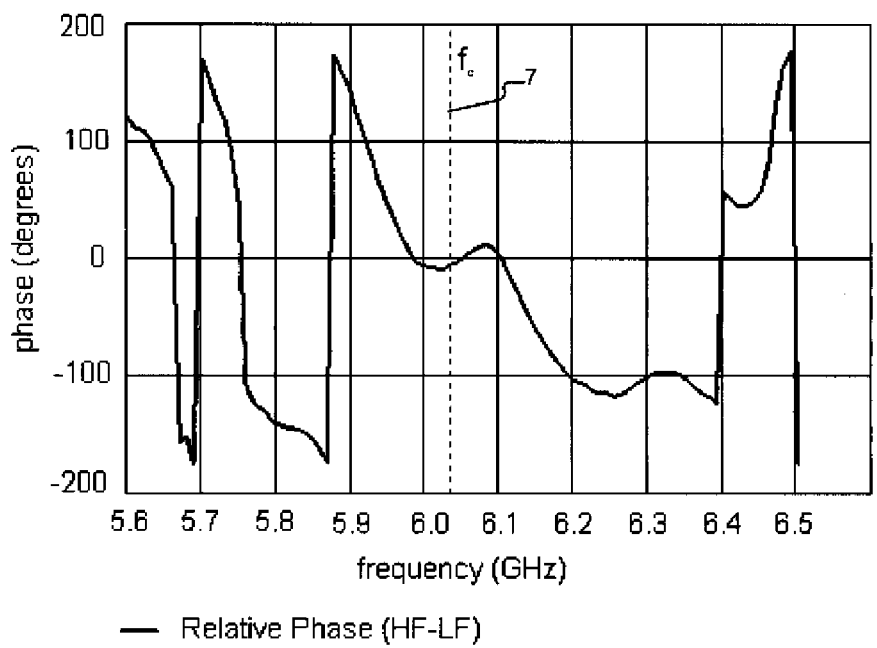
FIG. 2 is a phase response graph showing the relative phase between signals from two overlapping frequency bands.

FIG. 2 shows the relative phase between the high frequency and low frequency band responses over a range of frequencies. The frequency $f_c$ [7] (which is about 6.036 GHz) is shown where the minimum relative difference in magnitude between the two responses occurs. The relative phase is approximately zero at $f_c$ through the result of a coarse adjustment of the delay of either the low frequency or high frequency path relative to each other. It is also clear that the relative phase is generally not zero throughout the crossover region, and that it varies widely. The relative phase is not linear with frequency, which means that the group delay is varying with frequency.

The relative phase shown in FIG. 2 is shown wrapping about +/−180 degrees. At these discontinuities, the phase is crossing the +/−180 degree boundary. In the region of this boundary, one response is negative with respect to the other. The result of phasor addition of the responses in this region is that one response subtracts from the other. This illustrates the problem. In order to keep the responses from adding destructively, thus causing dips and holes in the combined response, the relative phase between the two responses should be kept away from the +/−180 degree phase boundaries.

The responses in FIG. 1 and FIG. 2 are generated as follows. Sinusoids are applied to each of two signal paths through an RF generator and digitized. The discrete Fourier transform (DFT) of the waveforms from each path are calculated and the magnitude and phase are measured for each signal path. While the absolute phase is measured for each path and subtracted to form the relative phase, the absolute phase need not be the true absolute phase so long as the relative phase derived from this measurement is correct.

Figure 3:
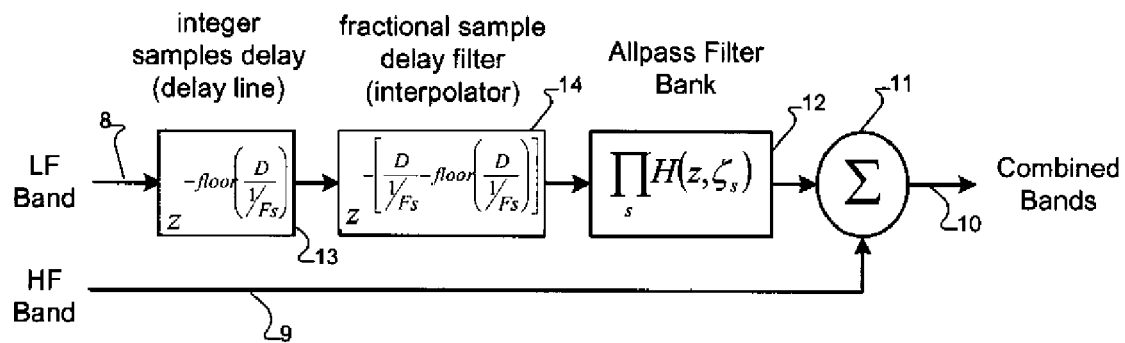
FIG. 3 is a block diagram of a phase compensation system.

In order to correct for the situation illustrated by FIG. 1 and FIG. 2, a system shown in FIG. 3 is preferably utilized where Fs is the system sample rate. In FIG. 3, two band signals enter the system through an low frequency input [8] and an high frequency input [9] and are summed at a summer [11]. A combined output [10] exits the system. In addition, this system consists of an allpass filter bank [12], which adjusts the relative phase throughout the crossover region (of, in this particular embodiment, the low frequency band signal. Of course the processing could be implemented in the high frequency band signal path as well). Further provided are delay elements consisting of a simple delay line [13] and a fractional delay filter [14]. The delay line and fractional delay filter cooperate to form an optimum time delay (D) that is determined in conjunction with the allpass filter coefficients.

Figure 15:
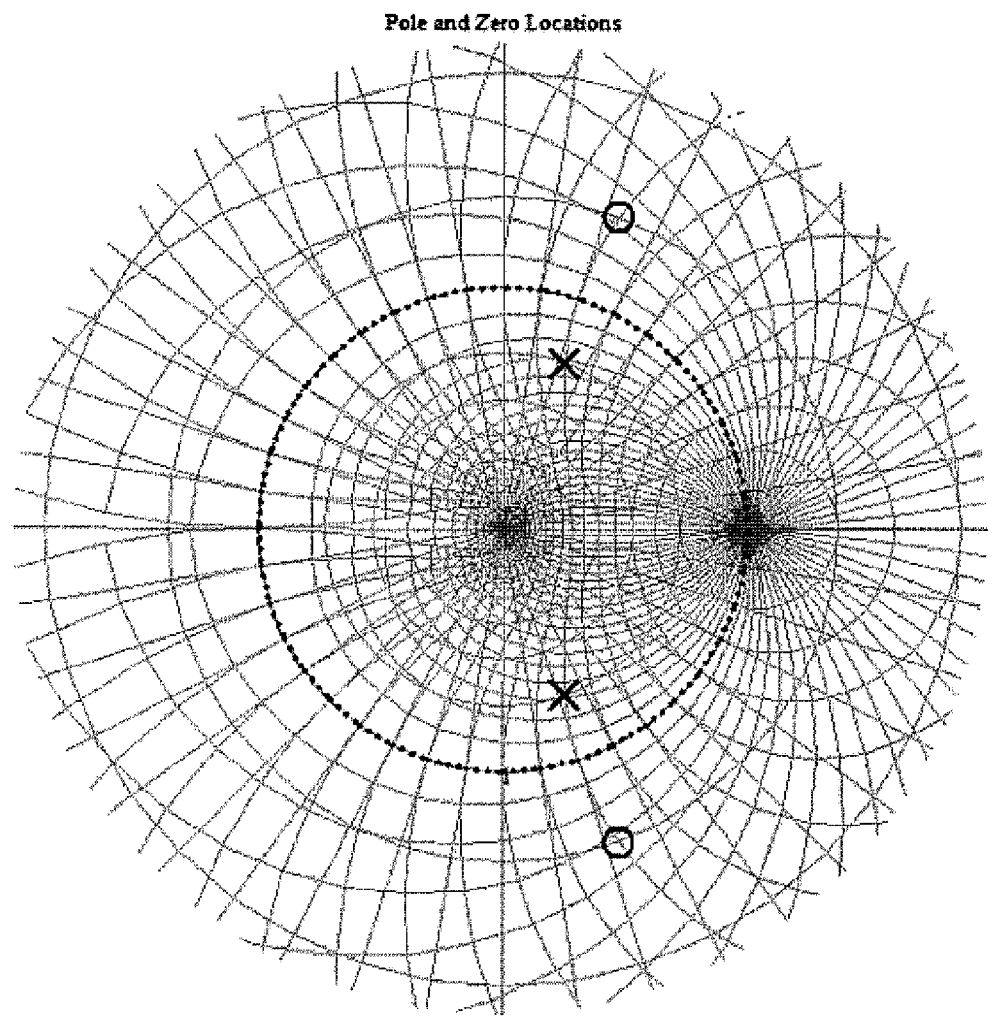
FIG. 15 is a graph showing the pole and zero locations of a second-order allpass filter section.

An allpass filter is a filter that significantly affects phase but does not substantially affect magnitude. A second order digital allpass filter is created by placing a pair of complex conjugate poles, one at $\zeta$ and the other at $\zeta^*$, along with a pair of complex conjugate zeros, one at $1/\zeta$ and the other at $1/\zeta^*$ as shown in FIG. 15.

The resulting transfer function of an allpass filter section, is therefore:

$$H(z) = \frac{|\zeta|^2 - 2 \cdot \text{Re}(\zeta) \cdot z^{-1} + z^{-2}}{1 - 2 \cdot \text{Re}(\zeta) \cdot z^{-1} + |\zeta|^2 \cdot z^{-2}} \quad \text{Equation 1}$$

Figure 16:
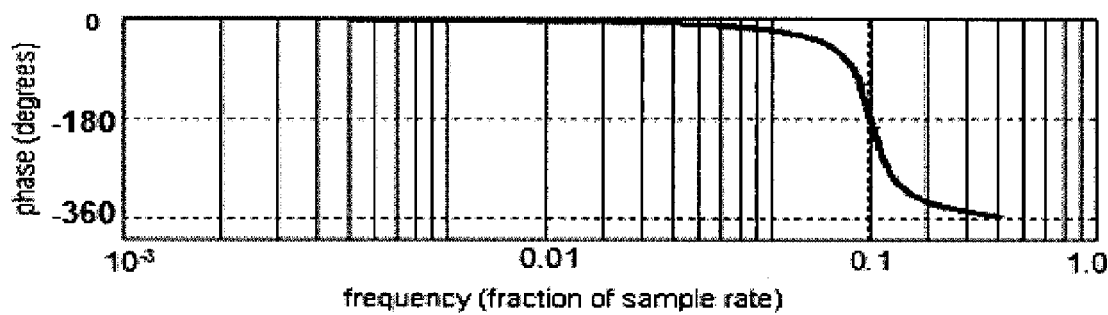
FIG. 16 is a phase response graph showing a phase contribution of a second-order allpass filter section.

As stated previously, the magnitude response of such an allpass filter section is unity. The phase response of such a section is shown in FIG. 16. An allpass filter section therefore supplies no gain/attenuation, but 360 degrees of phase lag.

Examining the problem illustrated in FIG. 1, it has been determined that a single section allpass filter with a response according to Equation 1, in conjunction with a delay will sufficiently correct the relative phase in the crossover region, provided these filters and delays are applied to the low frequency path and that optimum values of D and of $\zeta$ can be found.

Figure 4:
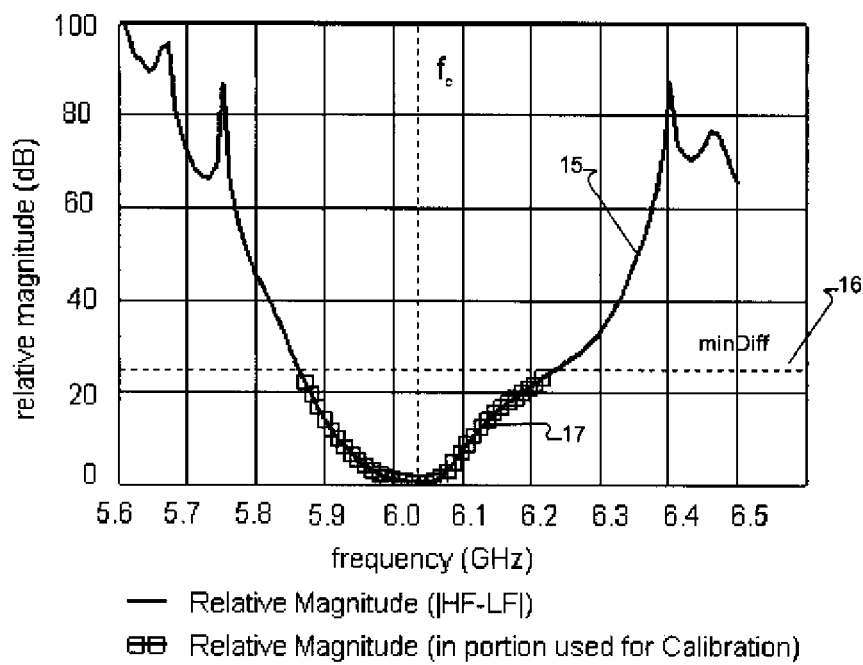
FIG. 4 is a magnitude response graph showing a relative magnitude of signals from two frequency bands.

To set about finding optimum values, first, the crossover region should be sufficiently defined and limited in scope. The crossover region is the region in which the relative magnitude difference between each band is lower than a pre-defined threshold. This is shown in FIG. 4. FIG. 4 shows the absolute magnitude response difference between the two paths [15] along with a minimum difference threshold (minDiff) [16]. Measurement points [17] below this difference threshold (minDiff) [16] are utilized for phase correction. The reason for this is because the large differences in relative magnitude are caused by either of the bands rolling off When a band rolls off, the phase measurement of the signal in that band becomes very inaccurate and therefore the relative phase measurement becomes very inaccurate. Since the phase correction will be fit to the relative phase measurement, it is important that the relative phase measurement be accurate.

This limitation in the application of phase compensation is acceptable, however, because the relative phase is unimportant when the magnitude of one signal is much larger than the other. In the case shown, minDiff has been chosen as 25 dB. This means that the phase is only considered when neither band is larger than the other by a factor of about 17. This does not effectively impose a limitation on the functionality of the system because the relative phase of two phasors summed together where one exceeds the other in magnitude by a factor of 17 can cause at most a dip of about 1 dB when the relative phase is at its worst, +/−180 degrees. In practical application, the situation will cause even less of a dip because the phase compensation is fit for all points where the relative magnitude is less than 25 dB difference and both bands are rolling off steeply outside this range. The worst case dip has been calculated as:

$$dip_{worst\_case} = 20 \cdot \log\left(\frac{10^{\frac{minDiff}{20}} + 1}{10^{\frac{minDiff}{20}} - 1}\right) \quad \text{Equation 2}$$

Figure 5:
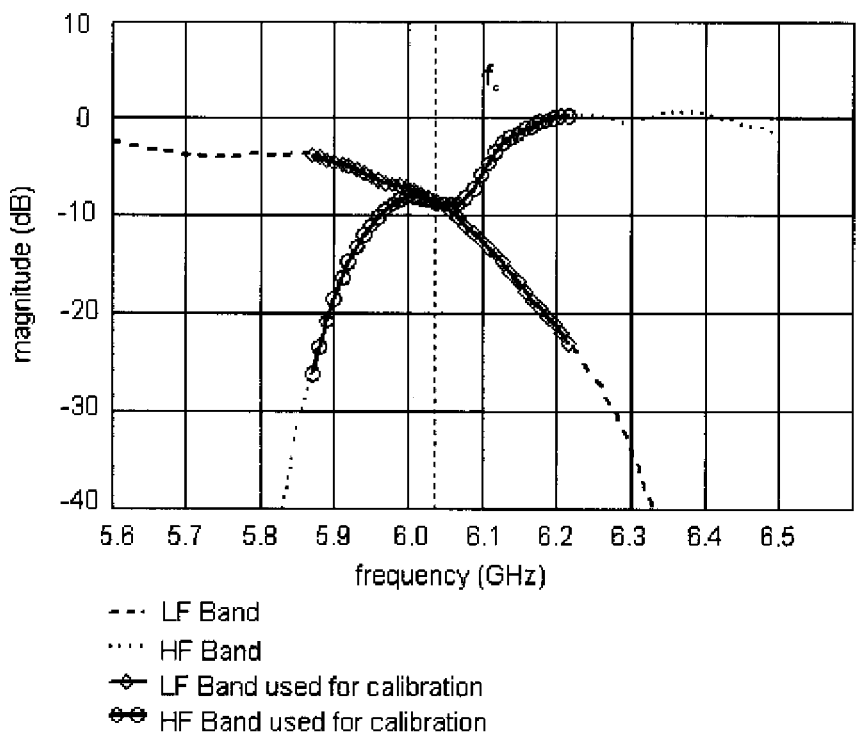
FIG. 5 is a magnitude response graph showing the magnitude of signals from two frequency bands.
Figure 6:
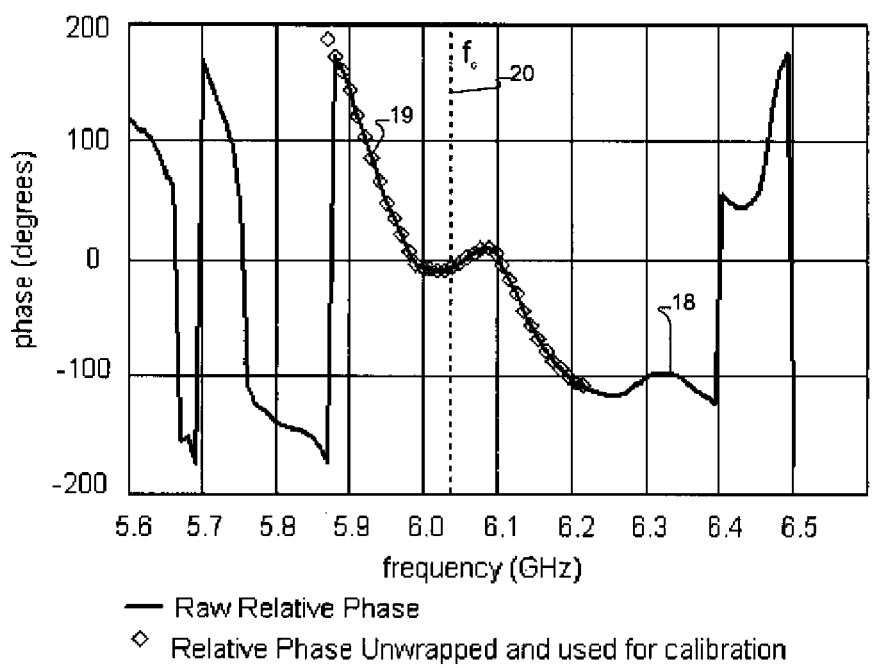
FIG. 6 is a phase response graph showing the raw and unwrapped relative phase of signals from two frequency bands.

The response region utilized in calculating phase compensation is therefore shown in FIG. 5. For this region, the relative phase between the two signals that is utilized for the fit is shown in FIG. 6. In FIG. 6, a raw phase difference [18] is shown along with a relative unwrapped phase difference [19] that is to be used in the processing.

Most phase unwrapping algorithms work from low frequency to high. In other words, the absolute phase is assumed correct at some low frequency, generally zero at zero frequency, and as the frequency is increased, discontinuities in the phase are corrected to be continuous with the absolute phase at low frequency. It is acceptable to use phase unwrapping algorithms that work in this manner, but it may be desirable to further correct the unwrapped phase to be near zero in the middle of the crossover region ($f_c$ [20]). If unwrapping the phase, regardless of the algorithm used, causes the phase at $f_c$ [20] to be a value outside the boundaries +/−180 degrees, it may be further adjusted by adding or subtracting multiples of 360 degrees as appropriate.

The unwrapped phase difference [19] forms the objective of the phase response of the system shown in FIG. 3. A more optimum phase response is therefore generated by finding optimum values of D and $\zeta$ such that the weighted error between the compensation system phase response and the objective is minimized in a least-squares sense. To generate the weights, a formula is employed that assigns greater weight to frequency regions where the relative magnitudes in each band are close and lower weight where the magnitudes differ greatly. Given a relative magnitude of relMag, such a formula comprises:

$$\text{weight}(dB_{rel}) = 10^{\frac{-dB_{rel}}{1000}}$$

Figure 7:
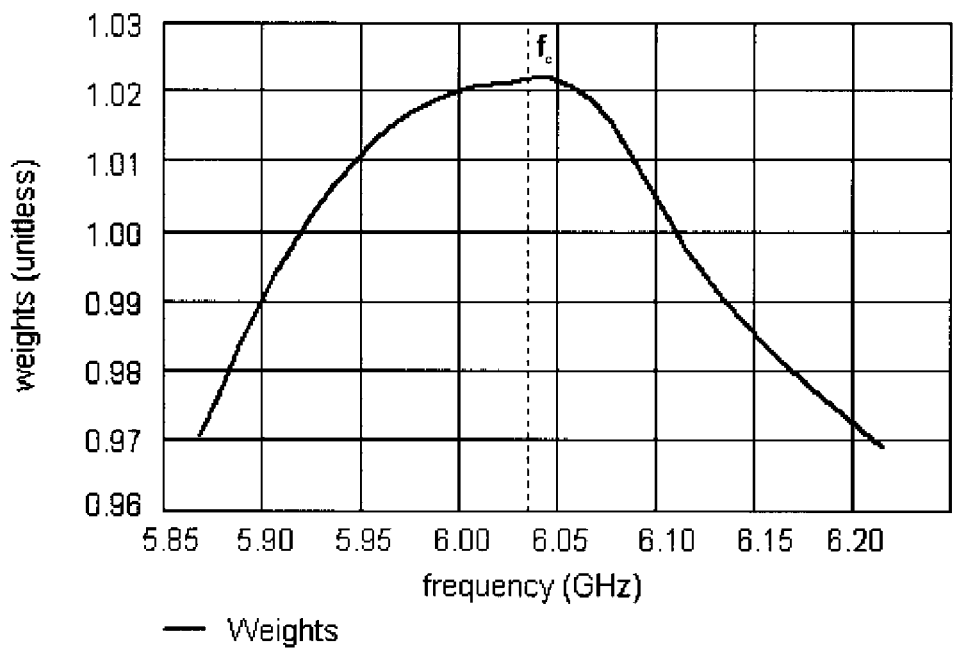
FIG. 7 is a graph illustrating a weighting function applied to various frequency regions utilized for a nonlinear fit.

The average weight value should be unity. The resulting weighting function used for this example is shown in FIG. 7.

In finding the optimum values, recognize that:

$$\zeta = M \cdot e^{j\theta} \quad \text{Equation 3}$$

Thus, there are two degrees of freedom corresponding to $\zeta$. The three values of M, $\theta$, and D are optimized.

The phase response of the system as a function of these three values is:

$$\Phi'\left(x = 2\cdot\pi\cdot\frac{f}{Fs}, M, \theta, D\right) = \tan^{-1}\left(\frac{\sin(x)\cdot M + \sin(\theta)}{\cos(x)\cdot M - \cos(\theta)}\right) +$$
$$\tan^{-1}\left(\frac{\sin(x)\cdot M - \sin(\theta)}{\cos(x)\cdot M - \cos(\theta)}\right) - \tan^{-1}\left(\frac{\sin(\theta)\cdot M + \sin(x)}{\cos(\theta)\cdot M - \cos(x)}\right) +$$
$$\tan^{-1}\left(\frac{\sin(\theta)\cdot M + \sin(x)}{\cos(\theta)\cdot M - \cos(x)}\right) + x\cdot D\cdot Fs$$

Equation 4

To keep the phase from wrapping, it is further adjusted as:

$$\Phi\left(x = 2\cdot\pi\cdot\frac{f}{Fs}, M, \theta, D\right) = \Phi'(x, M, \theta, D) - 2\cdot\pi$$

Equation 5 if $\cos(x) \leq M\cdot\cos(\theta)$

To perform the least-squares fit, the partial derivatives of the phase with respect each of the variables is defined:

$$\frac{\partial\Phi}{\partial M}\left(x = 2\cdot\pi\cdot\frac{f}{Fs}, M, \theta, D\right) =$$
$$\frac{-4\cdot\sin(x)\cdot(\cos(\theta)\cdot M^2 - 2\cdot\cos(x)\cdot M + \cos(\theta))}{\left(\begin{array}{c}1 - 2\cdot M^2 + M^4 + 4\cdot\cos^2(x)\cdot M^2 - 4\cdot\cos(x)\cdot M\cdot\\ \cos(\theta) - 4\cdot\cos(x)\cdot M^3\cdot\cos(\theta) + 4\cdot M^2\cdot\cos^2(\theta)\end{array}\right)}$$

Equation 6

$$\frac{\partial\Phi}{\partial\theta}\left(x = 2\cdot\pi\cdot\frac{f}{Fs}, M, \theta, D\right) =$$
$$\frac{-4\cdot(M^2 - 1)\cdot\sin(\theta)\cdot\sin(x)}{\left(\begin{array}{c}1 - 2\cdot M^2 + M^4 + 4\cdot\cos^2(x)\cdot M^2 - 4\cdot\cos(x)\cdot M\cdot\\ \cos(\theta) - 4\cdot\cos(x)\cdot M^3\cdot\cos(\theta) + 4\cdot M^2\cdot\cos^2(\theta)\end{array}\right)}$$

Equation 7

$$\frac{\partial\Phi}{\partial D}\left(x = 2\cdot\pi\cdot\frac{f}{Fs}, M, \theta, D\right) = x\cdot Fs$$

Equation 8

Since a nonlinear equation solver will be employed, an initial guess should be determined. It seems reasonable that the guess at D be zero. Regarding M and θ, consider that the digital allpass filter pole location ζ can be considered an approximation of an analog pole location σ using the matched z-transform:

$$\zeta = e^{\frac{\sigma}{Fs}}$$

Equation 9

Consider also that the upper-half-plane (UHP) pole location σ is the root of the characteristic equation:

$$s^2 + 2\cdot\pi\cdot\Delta f\cdot s + (2\cdot\pi\cdot f_0)^2$$

Equation 10

In Equation 10, $f_0$ is the center frequency and $\Delta f$ is the bandwidth. A reasonable guess for the allpass filter center frequency is $f_c$. A reasonable guess for the bandwidth is a fraction of the width of the region being considered. In the case shown in FIG. 6, $f_c$ is 6.036 GHz and forms the guess at $f_0$. The width of the band is about 350 MHz, so $1/10^{th}$ of the width, or 35 MHz, is used for the guess at $\Delta f$. To form the guess of M and θ, one finds the UHP root of Equation 10 as σ, applies σ to Equation 9, and finds the guess at M and θ as the magnitude and argument of ζ, respectively.

Figure 8:
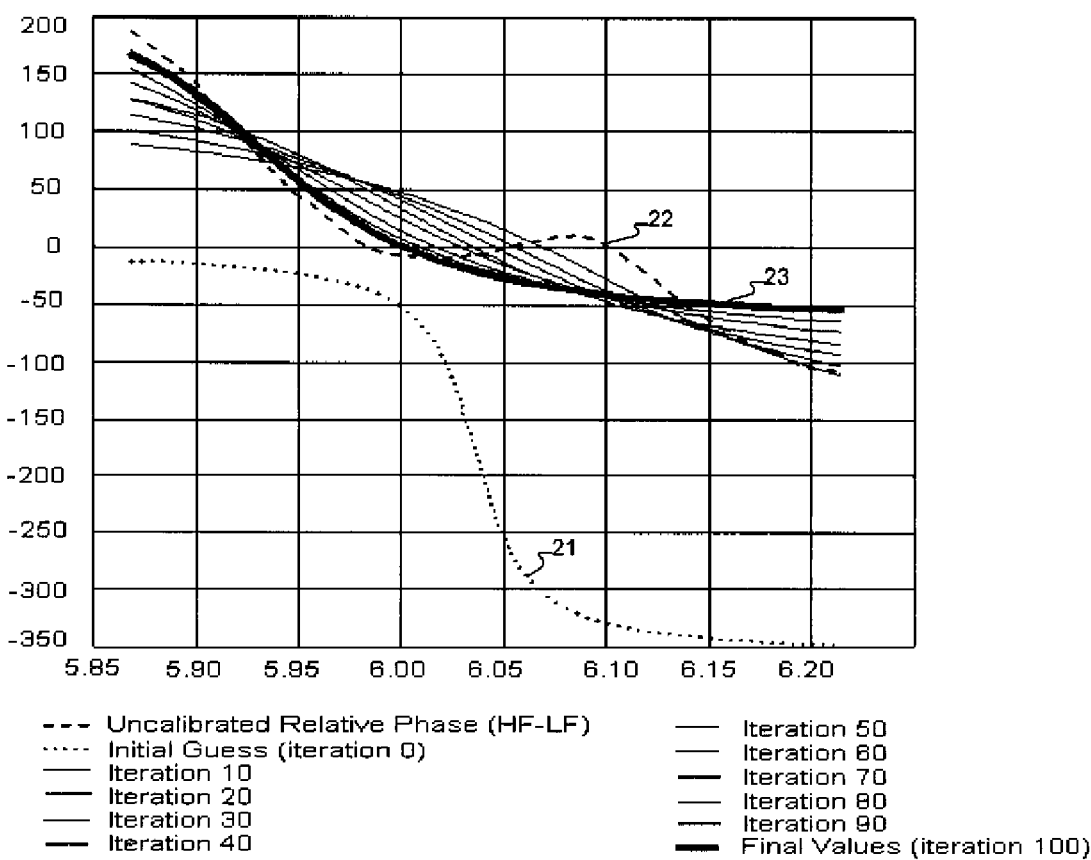
FIG. 8 is a graph illustrating resulting relative phase for many iterations of the Levenberg-Marquardt algorithm utilized to optimize filter characteristics.

The refinement of these guesses is performed by making repeated iterations of the Levenberg-Marquardt algorithm. One iteration of the algorithm is shown in FIG. 14. Upon the application of each iteration, new, better values of D, M and θ are arrived at. FIG. 8 shows this progress. The phase at iteration 0 resulting from the guess is shown [21] along with the phase response that is the object of the fit [22]. Many iterations are shown with more and more improvement. The final relative phase resulting from 100 iterations is shown [23].

Figure 9:
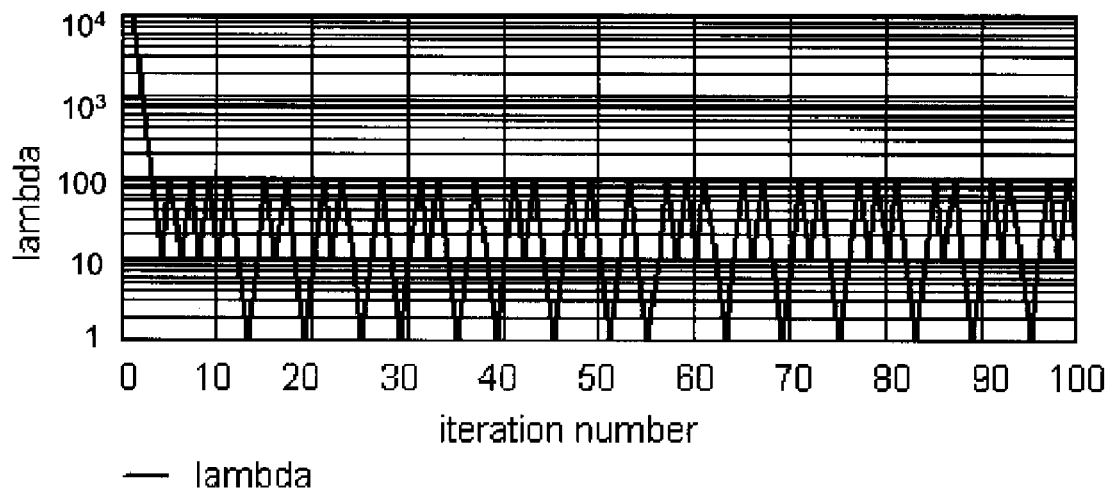
FIG. 9 is a graph showing a value of $\lambda$, a convergence steering variable, for each iteration of the Levenberg-Marquardt algorithm utilized to optimize the filter characteristics.
Figure 10:
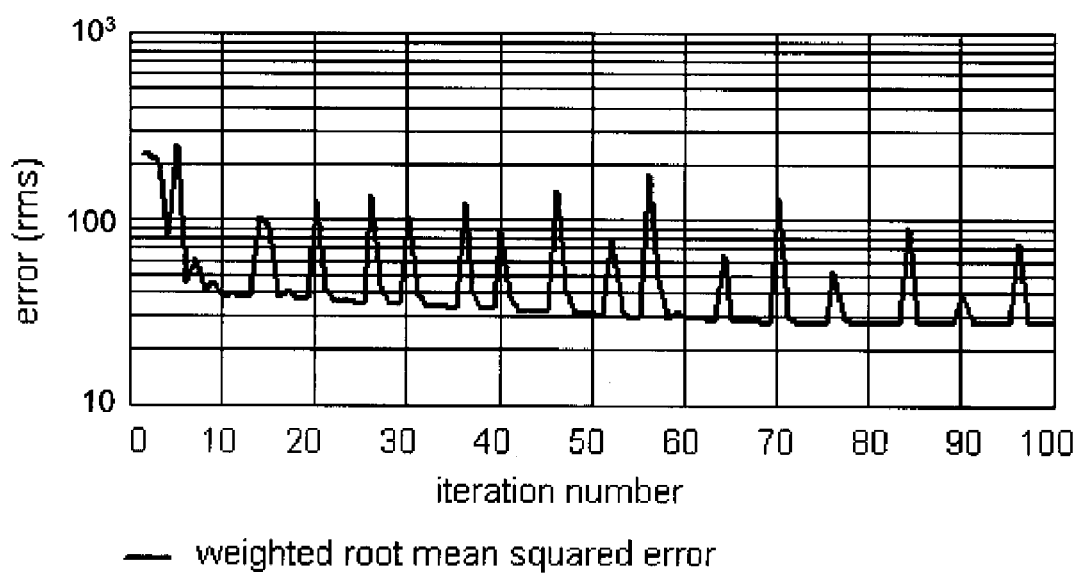
FIG. 10 is a graph of a root-mean-squared (rms) error for each iteration of the Levenberg-Marquardt algorithm utilized to optimize the filter characteristics.

During iterations of Levenberg-Marquardt, a value λ acts as a control variable that steers between Newton-Gauss convergence (small λ) and gradient method convergence (large λ). In this example, the value of λ was set initially arbitrarily high at 100,000. Its value throughout the fit is shown in FIG. 9. Often, the value of λ can be used to determine convergence, but in FIG. 9, it can be seen to bounce between 1 and 100. The root-mean-squared (rms) error throughout the fit is shown in FIG. 10. It can be seen that despite jumps, the lowest value levels off to around 30 degrees. This leveling off of the rms error signals convergence, and therefore the number of iterations of the algorithm was stopped at 100.

The resulting values of D, M, and θ result in a delay value to be utilized for the integer and fractional delay filters and a ζ to be utilized in the allpass filter section shown in FIG. 3. The delay is broken into an integer and fractional sample portion. The implementation of the integer sample delay may be accomplished through a delay line. The fractional delay filter may be a finite impulse response (FIR) filter whose coefficients are calculated through frequency sampling methods. This results in a filter represented by a Sinc function shaped response. Shifting the Sinc function accomplishes the fractional delay. Suitable approaches for designing frequency sampling filters are described in M. T. Jong, Methods of Discrete Signal and System Analysis, (McGraw Hill, 1982), 369-374).

Figure 17:
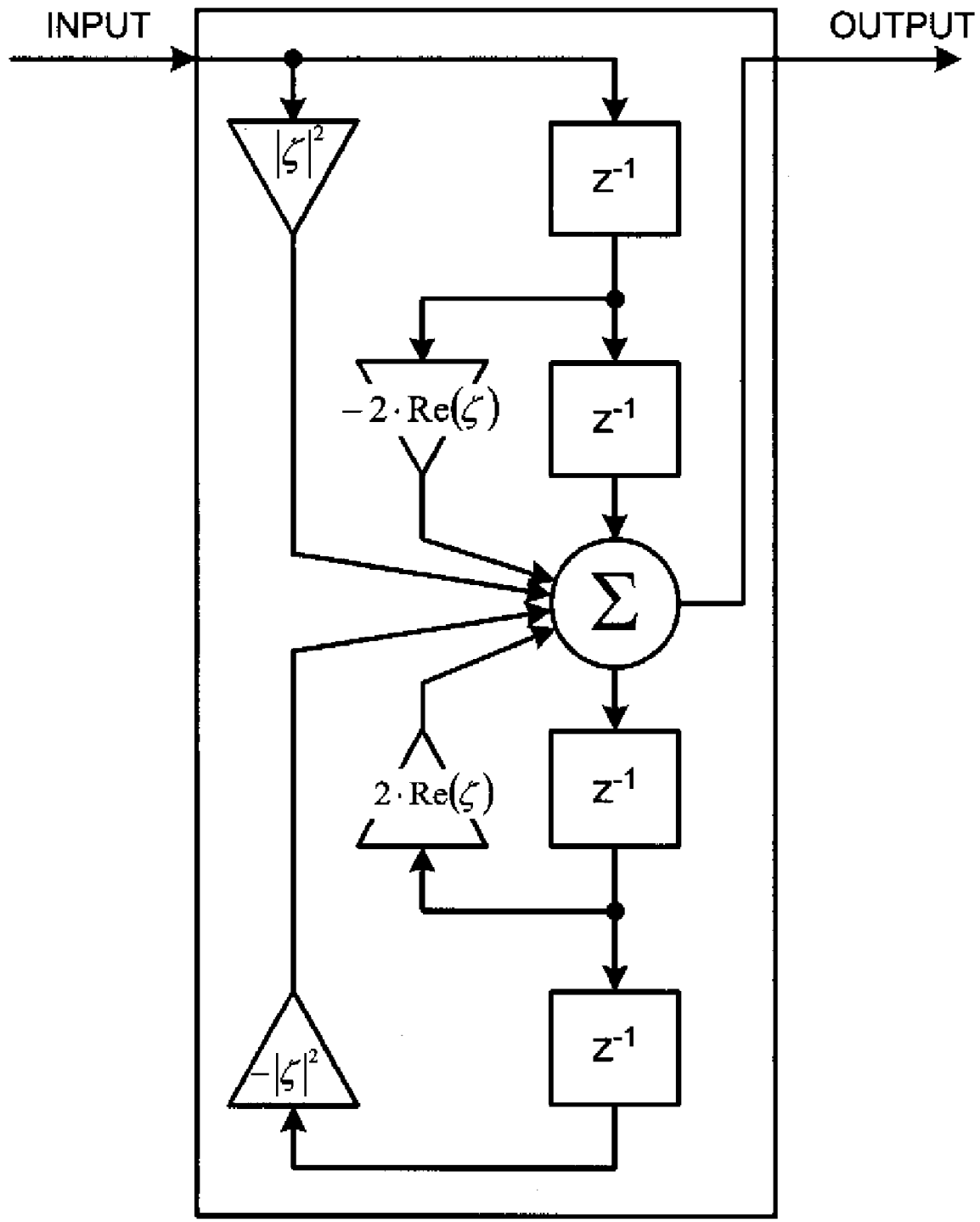
FIG. 17 is a block diagram of a filter implementation of a second-order allpass filter section.

The allpass filter pole location generates coefficients utilized in an infinite-impulse-response (IIR) implementation shown in FIG. 17.

Figure 11:
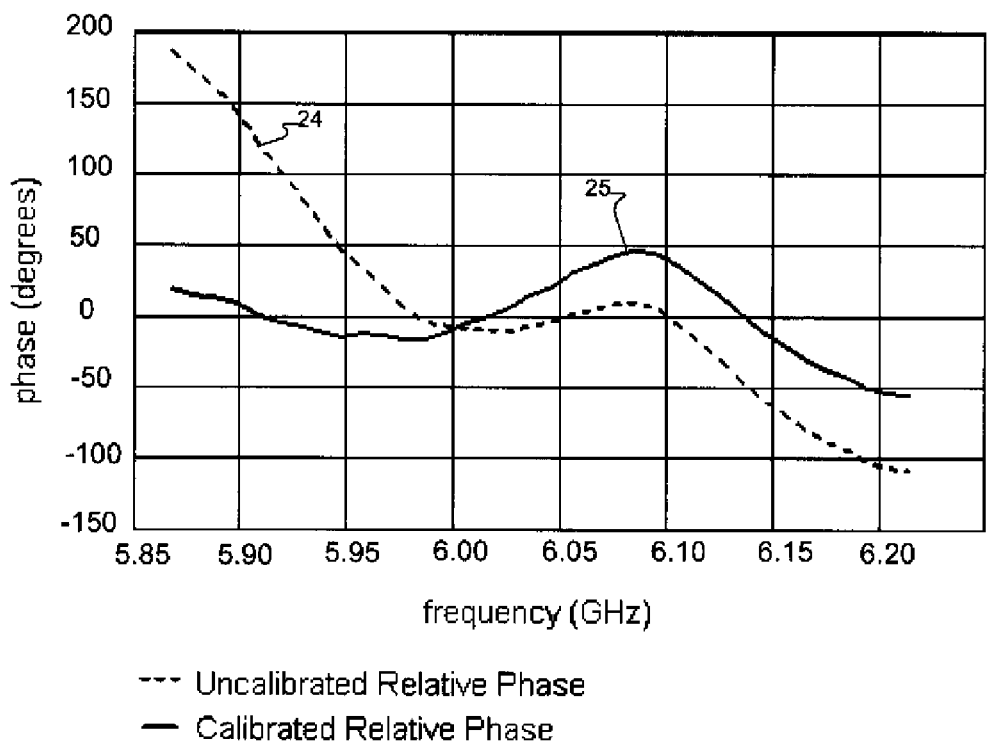
FIG. 11 is a graph of a comparison of the compensated and uncompensated relative phase of two signals from two frequency bands.

The resulting relative phase is shown in FIG. 11. Here, the uncalibrated relative phase [24] is shown along with the much improved relative phase [25] delivered as a result of the system shown in FIG. 3 utilizing the optimized variables.

Figure 12:
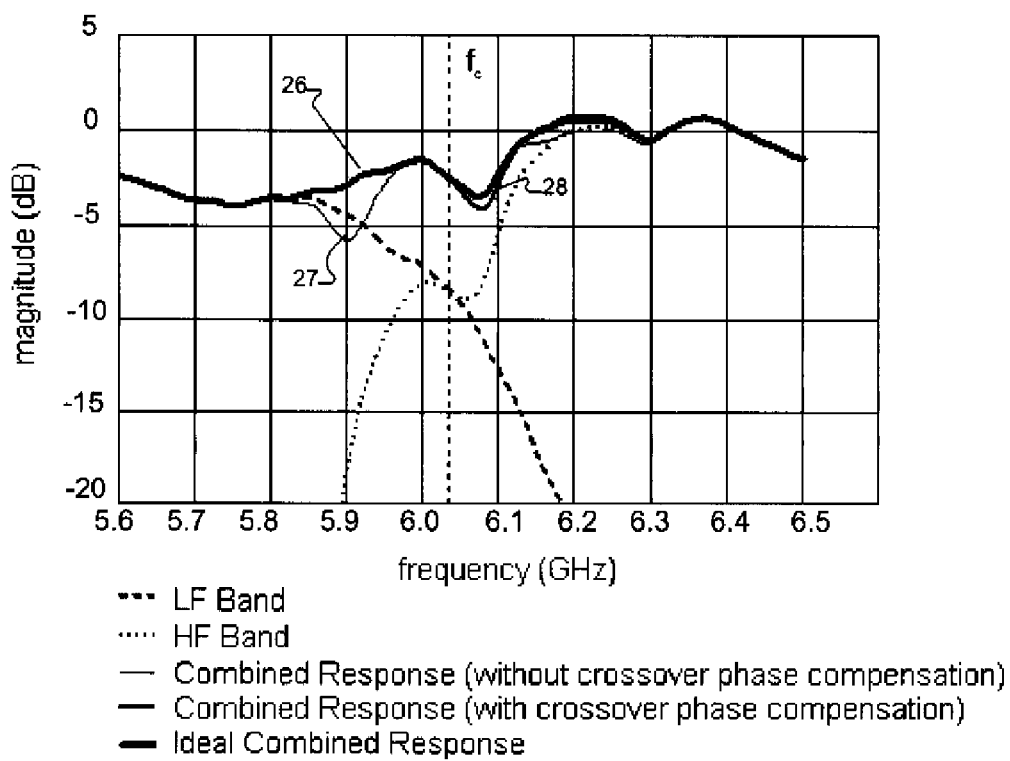
FIG. 12 is a graph showing the effect of compensating the relative phase of the two signals from the two frequency bands on the combined response of the two signals.

FIG. 12 shows the improvement in combined magnitude response as a result of this improved relative phase. Shown are the optimum response [26], the response prior to compensation [27] and the response as a result of compensation [28]. It is seen that the combined response with compensation better approximates the optimum response.

Figure 13:
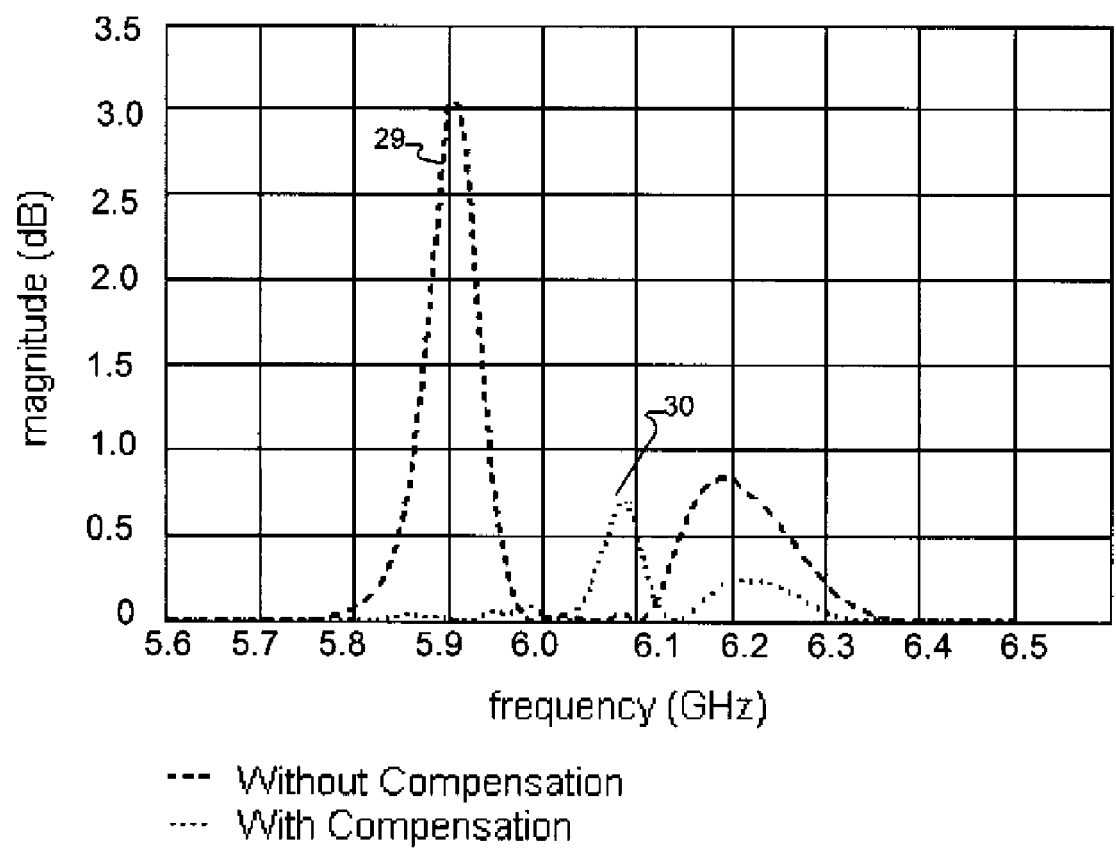
FIG. 13 is a graph showing a comparison of the size and frequencies of the dips in the magnitude response of two combined signals from two frequency bands with and without relative phase compensation.

FIG. 13 further illustrates the improvement. It shows the magnitude of the dip formed in the combined response in the uncompensated [29] and compensated [30] situation. It is seen that the magnitude of the dip as well as its frequency extent has been greatly reduced.

Figure 18:
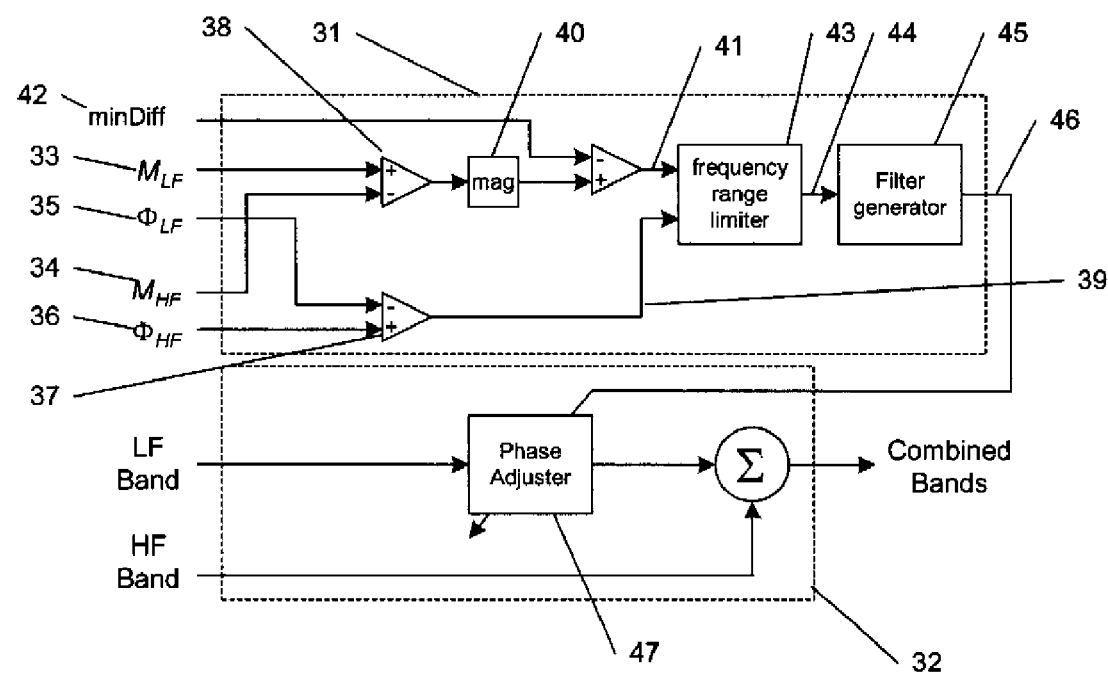
FIG. 18 shows a crossover phase compensation system.

FIG. 18 shows a crossover phase compensation system constructed in accordance with the present invention. The system comprises an element [32] that corrects the crossover phase described by the detail in FIG. 3 and an element [31] that generates filter coefficients for an allpass filter bank [12] and delay specification for an integer sample delay line [13] and a fractional delay filter [14]. The element [31] that generates the filter coefficients and delay specification takes as its input the frequency response of an LF and HF, each consisting of coordinates that define frequencies and magnitude responses [33] and [34] exemplified by [1] and [2] and phase responses [35] and [36], that when subtracted by the phase difference element [37] generates a relative phase [39] as exemplified in FIG. 2. The two magnitude responses are subtracted by magnitude difference element [38] and the magnitude of the difference is generated by magnitude component [40] to generate an absolute magnitude difference [41] exemplified by [15]. This absolute magnitude difference [41] is compared to a minimum magnitude difference threshold [42] exemplified in [16] to generate a range of frequencies exemplified by the points [17] that defines the range over which the relative phase [39] is utilized. Frequency range limiter [43] limits the frequency range of the relative phase [39] such that its output [44] consists of a limited relative phase as exemplified by [19]. This limited relative phase [44] is supplied to filter generator [45] to generate an output [46] in accordance with the methods previously described that contains filter coefficient and delay specification supplied to the phase adjuster [47].

It should be noted that the delay line, fractional delay filter, and allpass filter sections may be combined by convolving the impulse response of all three elements to generate a single FIR or IIR filter that can be applied to one path to accomplish the processing shown in FIG. 3. Such a composite filter will generally have a significantly higher order and require significantly more processor bandwidth.

The filters described herein may be implemented in discrete components, integrated circuits, microcode, software, and combinations of the foregoing. Discrete and integrated designs may achieve faster processing at the expense of circuit board or die space and design flexibility. Software implementations generally provide greater design flexibility and opportunity for user modification of filter parameters at the expense of increased processor overhead. Certain microcode implementations balance these tradeoffs, providing a certain degree of design flexibility but lower processing speeds than are generally attainable through custom hardware implementations.

Moreover, alternate algorithmic approaches may be implemented. For instance, in lieu of the integer delay, the crossover region definition need not be identified by use of threshold magnitude differences. The system may be configured to permit a user to input the crossover band to which a correction algorithm may be applied. The threshold may also be calculated rather than predetermined, as by comparison of actual frequency response to that of an applicable test signal. Moreover, approaches other than filter parameter fitting may be used to optimize crossover region phase correction. For instance, the crossover region may be sliced into a plurality of bands and the bands may be frequency aligned by an iterative combinational process in which destructive combination is distinguished from constructive combination. Each slice would be advanced or delayed sufficient to maximize the magnitude of the combined signal. Such a process may be more computationally intensive than the implementation illustrated in the attached figures but may achieve superior phase correction.

The techniques described herein can also be applied to the high frequency band or intermediate frequency bands. For instance, in a system involving combination of four frequency bands, there will be three crossover regions. The techniques described above may be applied successively or simultaneously to each crossover region to reduce phase error.

The integer delays, fractional delays, and allpass filter of the illustrated embodiment may be implemented in various ways. For instance, multiple allpass filter sections may be used. In lieu of delay lines, the waveform can be directly shifted. In lieu of shifting the sinc pulse, fractional delay may be achieved by other allpass filter networks. Additionally, all of the individual filter elements can be combined into a single digital filter element.

Furthermore, while the system is shown as applying to the combination of two signals, the combination of more than two signals, at either the same or different crossover regions, is contemplated.

The systems described herein may be applied to any apparatus acquiring multiple input signals, or even a single signal that is then divided into multiple pathways. Such an apparatus may comprise an oscilloscope, or other signal acquisition or testing system.

It will thus be seen that the objects set forth above, among those made apparent from the preceding description, are efficiently attained and, because certain changes may be made in carrying out the above method and in the constructions set forth without departing from the spirit and scope of the invention, it is intended that all matter contained in the above description and shown in the accompanying drawings shall be interpreted as illustrative and not in a limiting sense. It is also to be understood that the following claims are intended to cover all of the generic and specific features of the invention herein described and all statements of the scope of the invention which, as a matter of language, might be said to fall therebetween.

What is claimed:

1. A method for adjusting a phase relationship between signals from multiple frequency bands that are being summed to reduce potential destructive interference therebetween, comprising the steps of:
   identifying a crossover region corresponding to a frequency range in which a lower frequency content signal overlaps with a higher frequency content signal;
   determining a magnitude difference between a magnitude of the lower frequency content signal and a magnitude of the higher frequency content signal in the crossover region, a small magnitude difference being indicative of a possibility of excessive destructive interference between the signals;
   comparing the determined magnitude difference to a predetermined threshold to determine whether the determined magnitude difference is less than the predetermined threshold;
   if it is determined that the determined magnitude difference is less than the predetermined threshold, determining a phase difference in the crossover region between the signals and adjusting a phase of one of the signals so that the phase difference between the signals is reduced, thereby reducing the possibility of excessive destructive interference between the signals; and
   combining the adjusted signal with the other of the signals, thereby producing a composite frequency content having a substantially reduced crossover region phase error, and a substantially reduced likelihood of destructive interference between the signals.

2. The method of claim 1, further comprising applying an integer samples delay.

3. The method of claim 2, further comprising applying a fractional sample delay filter.

4. The method of claim 3, further comprising applying an allpass filter to adjust the relative phase of the signals.

5. The method of claim 4, wherein the integer samples delay, the fractional sample delay filter, and the allpass filter are convolved using impulse responses thereof to generate a single filter.

6. The method of claim 1, wherein the adjusting of one of the signals is performed in accordance with the function:

$$H(z) = z^{-D} \cdot \prod_{st} \frac{|\zeta_{st}|^2 - 2\cdot\text{Re}(\zeta_{st})\cdot z^{-1} + z^{-2}}{1 - 2\cdot\text{Re}(\zeta_{st})\cdot z^{-1} + |\zeta_{st}|^2 \cdot z^{-2}}$$

where z represents the z-transform variable defined as the exponential raised to the power j times 2 times π times the ratio of the frequency to the sample rate and j is the square-root of negative 1;

where st is an index referring to a filter stage;

where $\zeta_{st}$ is the location of the positive-real pole among the pair of complex conjugate poles that define their counterpart zeros that make up an all pass filter biquad section corresponding to the filter stage designated by st;

where D is an integer corresponding to a fixed integer delay; and where Π is an operator that defines the aggregate transfer function as the product of transfer function sections that correspond to stage st.

7. The method of claim 1, wherein the combination of the signals is substantially constructive at the frequencies where the phase of the one of the two signals is adjusted.

8. The method of claim 1, further comprising minimizing a weighted least squares error between the phases of the signals.

9. The method of claim 1, wherein adjusting the phase of the one of the signals signal comprises iteratively determining a plurality of filter parameters.

10. A method for improving a response upon the combination of two signals to reduce potential destructive interference therebetween, comprising the steps of:

determining a magnitude difference between the two signals in a crossover region between the two signals, a small magnitude difference being indicative of a possibility of excessive destructive interference between the signals;

comparing the determined magnitude difference to a predetermined threshold to determine whether the determined magnitude difference is less than the predetermined threshold;

if it is determined that the determined magnitude difference is less than the predetermined threshold, determining a relative phase difference between the two signals within the crossover region;

adjusting a phase of one of the two signals to reduce a phase difference therebetween; and combining the phase-adjusted signal and the other of the two signals.

11. The method of claim 10, wherein the crossover region is predetermined.

12. The method of claim 10, wherein the combination of the signals is substantially constructive at the frequencies where the phase of the one of the two signals is adjusted.

13. The method of claim 10, further comprising minimizing a least squares weighted error between the phases of the signals.

14. The method of claim 10, wherein adjusting the phase of the one of the two signals comprises iteratively determining a plurality of filter parameters and applying a phase unwrapping algorithm.

15. A system for improving a response upon the combination of two or more signals to reduce potential constructive interference therebetween, comprising:

a comparator for comparing a magnitude difference between the two or more signals in a crossover region therebetween to a predetermined threshold to determine whether the magnitude difference is less than the predetermined threshold;

a phase adjusting element for adjusting a phase of one or more of the two or more signals if it is determined that the magnitude difference is less than the predetermined threshold, thereby reducing the possibility of excessive destructive interference between the signals, said phase adjusting element employing one or more filter coefficient and delay specification; and a combiner for combining the phase-adjusted signals and the other of the signals.

16. The system of claim 15, wherein the combination of the signals is constructive at the frequencies where the phase of the one or more of the two or more signals is adjusted.

17. The system of claim 15, wherein the signals overlap at the frequencies where the phase of the one or more of the two or more signals is adjusted.

\* \* \* \* \*